United States Patent [19]

Fraden

[11] Patent Number: 4,538,074
[45] Date of Patent: Aug. 27, 1985

[54] POWER SWITCH

[75] Inventor: Jacob Fraden, Hamden, Conn.

[73] Assignee: Healthcheck Corporation, Cheshire, Conn.

[21] Appl. No.: 525,864

[22] Filed: Aug. 24, 1983

[51] Int. Cl.³ .................... H01H 43/00; H03K 17/28
[52] U.S. Cl. .................................. 307/126; 307/141; 307/141.4; 307/597; 361/196
[58] Field of Search ............ 307/116, 126, 141, 141.4, 307/597, 249; 361/83, 89, 196

[56] References Cited

U.S. PATENT DOCUMENTS

| | | | |
|---|---|---|---|
| 3,621,276 | 11/1971 | Mitchell | 361/18 X |
| 4,112,764 | 9/1978 | Turner | 307/597 X |
| 4,134,027 | 1/1979 | Scott et al. | 307/141 |
| 4,267,467 | 5/1981 | Tsukoda | 307/141 X |
| 4,359,655 | 11/1982 | Fukui | 307/597 X |

Primary Examiner—Reinhard J. Eisenzopf
Assistant Examiner—Derek S. Jennings
Attorney, Agent, or Firm—William C. Crutcher

[57] ABSTRACT

An improved power switch circuit for turning on manually and for turning off either manually or automatically a battery operated electronic instrument. The circuit includes one manual momentary contact on/off switch, a bilateral switch or transmission gate, a microprocessor, and a capacitor that charges to a threshold level when the on/off switch is momentarily closed (on) and that discharges when either the on/off switch is momentarily closed again (off) or after a fixed amount of time has elapsed as determined by the microprocessor. The bilateral switch is switched on when the threshold potential is reached thereby preconditioning the on/off switch for turning the instrument off. The on/off switch can now be closed to discharge the capacitor or the microprocessor can discharge the capacitor thereby switching off the bilateral switch and preconditioning the on/off switch for again turning on the power to the electronic instrument.

9 Claims, 1 Drawing Figure

POWER SWITCH

BACKGROUND OF THE INVENTION

This invention relates to an improved power switch circuit for turning on manually and for turning off either manually or automatically a battery operated electronic instrument.

A conventional power switch utilizes one "on" switch and one "off" switch for manually turning on or off the power to an electronic instrument. Generally, depressing the "on" switch provides a current to the base of a first transistor thereby turning it on. The first transistor conducts a signal to a timer circuit which produces a signal for turning on a second transistor that provides battery supplied power to the electronic instrument. The "on" switch is then bypassed and the power to the electronic instrument remains on until the timer, automatically after a fixed period of time elapses, turns off the second transistor or when the "off" switch is activated.

U.S. Pat. No. 4,112,764 issued to Turner discloses an automatic on/off digitally timed electronic switch which is responsive to momentary operation of an actuator to turn on and remain on for a predetermined interval of time. The switch has a latching circuit adapted for connection to a power supply and a drive circuit responsive to the momentary supply of power by operation of the actuator to provisionally begin operating and to provide a gating signal to operate the latching circuit. A means is provided for interconnecting the latching circuit and drive circuit for subsequently continuing the operation of the drive circuit independent of the momentary supply of power. A digital timer circuit includes a counter that is responsive to the momentary operation of the actuator to begin counting and to provide, after a predetermined count, an output signal to automatically inhibit further operation of the drive circuit and de-energize the latching circuit.

U.S. Pat. No. 3,965,743 also issued to Turner discloses an automatic electronic switch that is responsive to an actuator to turn on and provide power from a power supply to a circuit during a predetermined interval of time and to automatically turn off at the end of the predetermined time interval thereby turning off power to the circuit.

U.S. Pat. No. 3,621,276 issued to Mitchell discloses a circuit in which a supply battery is connected across a capacitor such that the capacitor charges to the voltage level of the supply battery to effect closure of a current path through the circuit. When the battery is disconnected across the capacitor, the capacitor discharges, thereby breaking the current path through the circuit after an interval of time determined by the rate of fall of the voltage across the capacitor.

It is therefore an object of this invention to provide an improved power switch circuit that is manually turned on and either manually or automatically turned off.

Another object of this invention is to provide an improved power switch circuit having only one momentary contact on/off switch for manually turning on or off the power supplied to an electronic instrument electrically connected to the power switch circuit.

A further object of this invention is to provide an improved power switch circuit having an electronic switch for reconfiguring the circuit when power is being supplied to an electronic instrument so that the on/off switch may again be manually activated to turn off the power.

SUMMARY OF THE INVENTION

An improved power switch circuit is disclosed of the type having a first transistor for providing power to an electronic instrument and a second transistor electrically connected to the first transistor for controlling the first transistor. One momentary switch is provided for manually turning on or off the first transistor thereby turning on or off the power to an electronic instrument electrically connected to the power switch circuit. A timing means also connected to the first transistor supplies first output signals to the second transistor when the first transistor is turned on, and supplies second output signals to the second transistor either when the first transistor is turned off or after a predetermined time has elapsed. A capacitor is electrically connected for charging to a threshold potential level when the first transistor is turned on and for discharging when the first transistor is turned off or after a predetermined time has elapsed or after an event has occured. A bilateral switch, electrically connected to the capacitor, switches on to place the power switch circuit in a second circuit configuration when the capacitor reaches the threshold potential level and switches off to place the power switch circuit in a second circuit configuration when the capacitor discharges.

DESCRIPTION OF THE PREFERRED EMBODIMENT

Figure 1:
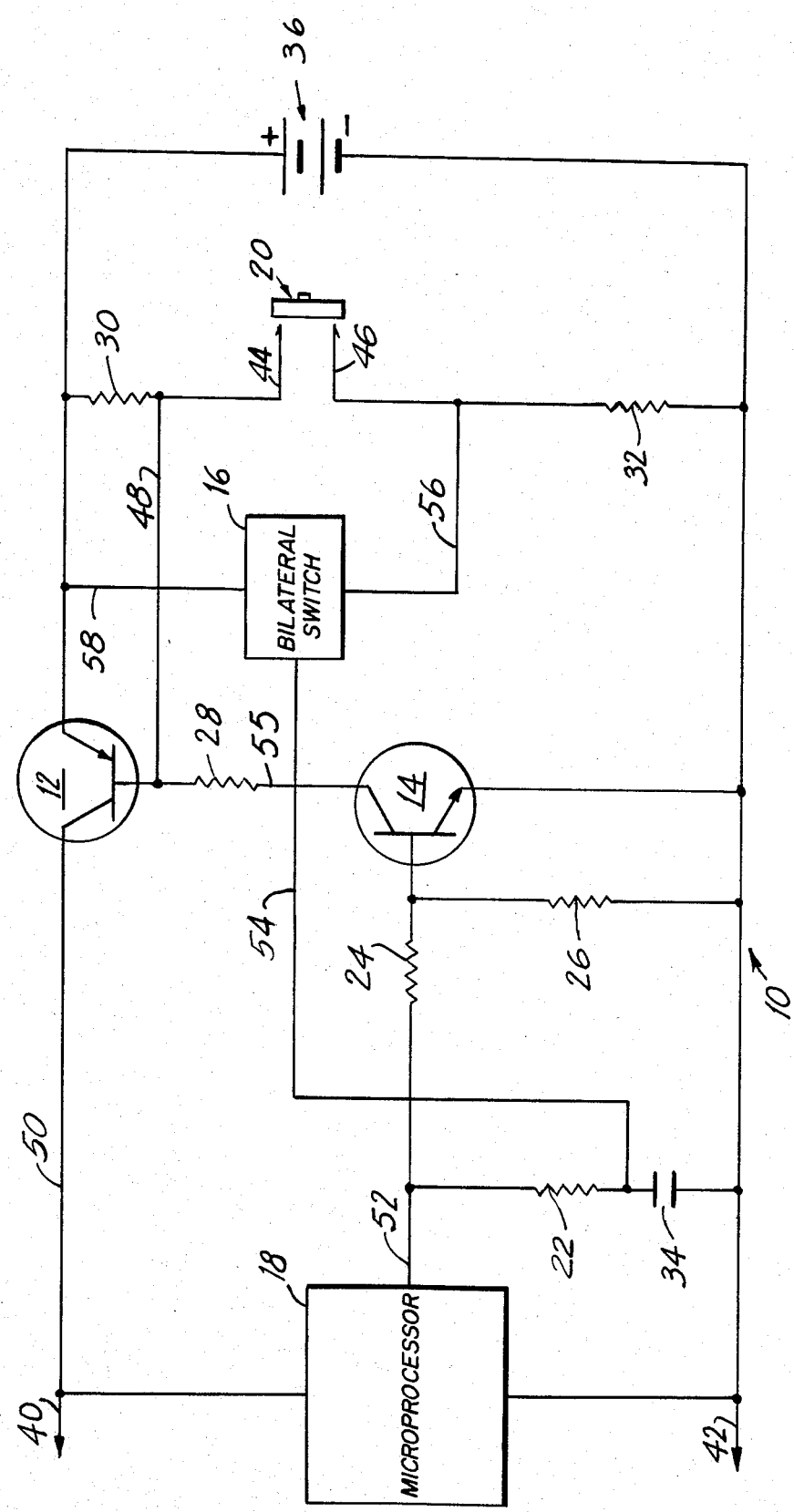
FIG. 1 is a schematic diagram showing the power switch of the present invention.

There is shown in FIG. 1 an improved power switch circuit 10 for turning on manually (from the "off" state) and for turning off either manually or automatically (from the "on" state) an electronic instrument (not shown) to which the power switch is electrically connected. Power switch circuit 10 includes first transistor 12, second transistor 14, bilateral switch 16 (a CMOS transmission gate), microprocessor 18, momentary on/off switch 20, first and second contacts 44 and 46, first, second, third, fourth, fifth, and sixth resistors 22, 24, 26, 28, 30, and 32, respectively, and capacitor 34. Power switch circuit 10 is electrically connected between the circuitry of an electronic instrument (not shown), via leads 40 and 42, and the power supply, such as battery 36, which provides electrical power for the electronic instrument. The power switch provides a means for permitting the power supply to provide power to the electronic instrument when, for example, pushbutton (on/off switch) 20 is manually depressed as well as a means for preventing power from being applied to the electronic instrument when either the pushbutton is manually depressed again or microprocessor 18 determines that power to the electronic instrument must be shut off. For example, the microprocessor is programmed to prevent power from being applied to the electronic instrument when a fixed time interval has elapsed or when an error condition (an event) occurs or when an electrical fault (an event) occurs in the electronic instrument. In response to the occurrence of an event or at the end of the fixed time interval, the computer program provides a LOW output signal (a programmed output signal) that turns off the second transistor in a manner known in the art. The microprocessor is responsive to error conditions and electrical faults that occur in the electronic instrument and generates a signal on line 52 for turning off the first transistor and "shutting down" the power to the instrument in the manner fully described herein.

In power switch circuit 10, the collector of second transistor 14 is connected to the base of first transistor 12 via line 55. The emitter of the second transistor is connected to ground (negative side of battery 36) while its base is connected to microprocessor 18 via line 52. The emitter of the first transistor is connected to the positive side of battery 36 while its collector is connected to an electronic instrument via line 50 and lead 40. Capacitor 34 is connected between line 52, i.e. the microprocessor, and ground. The capacitor and resistor 22 together form a delay circuit. Bilateral switch 16 is connected between the first transistor's emitter via line 58 and the negative side of the battery via line 56 as well as to the delay circuit via line 54. Contacts 44 and 46 are connected between the first transistor's emitter and ground with the first contact also being tied to the base of the first transistor by line 48.

In order to supply power from battery 36 to the electronic instrument momentary contact or on/off switch 20 is activated to momentarily engage first and second contacts 44 and 46, respectively. Momentarily activating on/off switch 20 permits current to be drawn through sixth resistor 32 from the base of first transistor 12 to the negative side of battery 36 via line 48. With the base current fixed by sixth resistor 32, the first transistor is turned on to provide an output current signal on line 50 to lead 40. The electronic instrument is now in the "on" state.

Microprocessor 18, in response to the power supplied on line 50, transmits a HIGH voltage first output signal on line 52 which provides a current through second resistor 24 to the base of second transistor 14. Second transistor 14 is, therefore, turned on and conducts a current on line 55, through fourth resistor 28, to the base of the first transistor permitting the first transistor to continue to conduct current on line 50. At substantially the same time, the HIGH voltage signal on line 52 provides a current through first resistor 22 in order to charge capacitor 34. Depending upon the values of first resistor 22 and capacitor 34, the charging capacitor will, after a delay in time, reach a threshold potential level. Bilateral switch 16 receives a control signal along line 54 in response to the threshold potential level which switches it "on" thereby providing a closed path between line 56 and line 58. The electronic instrument may now be turned off either manually, by momentarily activating on/off switch 20 again, or automatically, by a LOW voltage second output signal transmitted by microprocessor 18 on line 52 after a predetermined time interval has elapsed or after an event has occurred. In effect, bilateral switch 16 provides for a change in the electrical connection of switch 20 from the base of first transistor 12 and sixth resistor 32 to the emitter of first transistor 12 and fifth resistor 30 thereby changing the function of switch 20, i.e. it can be used as both an "on" and "off" switch depending on the power switch circuit configuration.

When power to the electronic instrument is turned off manually, on/off switch 20 is activated by momentarily making contact with first and second contacts 44 and 46. When the on/off switch is activated, the base of the first transistor becomes electrically connected to its emitter and the positive side of the battery. That is, there is no potential difference across fifth resistor 30 which is between the emitter and the base of the first transistor. The first transistor is no longer properly biased and stops conducting on line 50. Microprocessor 18, in response to no power supply over line 50, transmits a LOW voltage signal on line 52 to the base of the second transistor thereby turning it off. Capacitor 34 discharges through first, second, and third resistors 22, 24, and 26 to ground thereby removing the control signal previously applied to bilateral switch 16 switching it "off". The electronic instrument is again in the "off" state and may be switched to the "on" state by momentarily activating on/off switch 20 again.

When power to the electronic instrument is turned off automatically, the microprocessor transmits a LOW voltage signal to the base of the second transistor thereby turning it off. The LOW voltage signal is provided under software control after a predetermined time has elapsed i.e. based on the instructions in the computer program stored and executed in the microprocessor which thereby acts as a timing means. Since the second transistor no longer conducts, base current is no longer provided to the first transistor thereby turning it "off". Capacitor 34 discharges, as described above, thereby switching "off" bilateral switch 16. The electronic instrument is again in the "off" state and may be turned on again by activating on/off switch 20. Microprocessor 18 effectively controls the state of the second transistor, i.e. either on or off.

In this embodiment, first transistor 12 is a 2N3906, pnp silicon transistor, second transistor is a 2N4401, npn silicon common emitter transistor, and the bilateral switch is a CD4066 CMOS transmission gate acting as a single throw function switch (spst). The delay portion of the power switch circuit which includes first resistor (R) 22 and capacitor (C) 34 which are selected so that the RC time constant is between one (1) and two (2) seconds. Microprocessor 18 is a COP-421 manufactured by National Semiconductor Corp. but it is understood that substantially any type of timer circuit could be implemented in lieu thereof.

What is claim is:

1. In a power switch circuit of the type having a first transistor connected for switching power from a battery to an electronic instrument and a second transistor electrically connected to said first transistor for controlling said first transistor, the improvement comprising:

a momentary contact switch arranged so that its closure will turn said first transistor on when connected in a first power switch circuit configuration, and arranged so that its closure will turn said first transistor off when connected in a second power switch circuit configuration, a bilateral switch electrically connected to place the power switch circuit into either of said first or second circuit configurations when said bilateral switch is deactivated or activated, respectively, timing means responsive to turning on and off of said first transistor and having an output line connected to said second transistor, said timing means providing a first output signal to turn on the second transistor when the first transistor turns on and providing a second output signal to turn off the second transistor either when the first transistor turns off or after a predetermined time has elapsed, and a capacitor coupled to said bilateral switch, said capacitor being connected to charge when the first transistor turns on to activate said bilateral switch and to discharge when said first transistor turns off to deactivate said bilateral switch.

2. The power switch of claim 1 in which said timing means is a microprocessor and in which said first output signals are HIGH in response to the momentary closure of said momentary contact switch in said first circuit configuration.

3. The power switch of claim 1 in which said timing means is a microprocessor and in which said second output signals are LOW.

4. The power switch of claim 1 in which said capacitor is electrically coupled to a resistor to form a delay circuit.

5. The power switch of claim 1 in which said bilateral switch provides for a change in the electrical connection of said momentary contact switch from the base of said first transistor to the emitter of said first transistor for switching on and off power to said electronic instrument.

6. The power switch of claim 3 in which said LOW second output signals are provided automatically by said microprocessor in response to the output of a software program after a predetermined fixed amount of time.

7. The power switch of claim 3 in which the LOW second output signals are provided in response to the manual momentary closure of said momentary contact switch.

8. The power switch of claim 3 in which said LOW second output signals are provided automatically by said microprocessor in response to the output of a software program upon the occurrence of preselected events.

9. In a power switch of the type that provides power to an electronic instrument including a second transistor having a collector electrically connected to the base of a first transistor and a battery power supply having first and second terminals in which said first terminal is electrically connected to the emitter of said first transistor and in which said second terminal is electrically connectd to the emitter of said second transistor, the improvement comprising:

one momentary contact switch having a first contact electrically connected to said first terminal of said battery power supply and a second contact electrically connected to said second terminal of said battery power supply and adapted to make contact with said first and second contacts for turning on and off said first transistor, a microprocessor electrically connected to the collector of said first transistor, to said second terminal of said battery power supply and to the base of said second transistor and responsive to said first terminal of the battery power supply being connected to the microprocessor by said first transistor upon first activation of said momentary contact switch, said microprocessor providing first output signals to said second transistor for turning on said second transistor and responsive to a second activation of said momentary contact switch which turns off said first transistor providing second output signals to said second transistor for turning off said second transistor, a capacitor electrically connected to the base of said second transistor and to the second terminal of said battery power supply and responsive to said first output signals provided by said microprocessor for charging to a threshold potential level and responsive to said second output signals for discharging below said threshold potential level, and a bilateral switch electrically connected to said capacitor and responsive to said threshold potential level for switching on thereby electrically connecting said second contact of said momentary contact switch to the emitter of said first transistor to provide for activation of said momentary contact to turn off said first transistor, and responsive to the discharge of said capacitor for switching off thereby electrically connecting said second contact of said momentary contact switch to the second terminal of said battery power supply to provide for activation of said momentary contact switch to turn on said first transistor.

* * * * *